US005898138A

United States Patent [19]

Delgado, Jr.

[11] Patent Number: 5,898,138

[45] Date of Patent: Apr. 27, 1999

[54] LOUDSPEAKER HAVING HORN LOADED DRIVER AND VENT

[76] Inventor: Roy Delgado, Jr., Rt. 3, Box 163B, Rosston, Ark. 71858

[21] Appl. No.: 08/898,707

[22] Filed: Jul. 22, 1997

[51] Int. Cl.[6] .......... H05K 5/00

[52] U.S. Cl. .......... 181/152; 181/156

[58] Field of Search .......... 181/152, 154, 181/156, 179, 184, 192, 195, 199; 381/156, 154

[56] References Cited

U.S. PATENT DOCUMENTS

| | | | |
|---|---|---|---|
| 3,356,179 | 12/1967 | Tompkins | 181/152 |
| 3,608,665 | 9/1971 | Drisi . | |
| 4,146,111 | 3/1979 | Mae et al. | 181/156 |
| 4,215,761 | 8/1980 | Andrews | 181/152 |
| 4,286,688 | 9/1981 | O'Malley | 181/156 |
| 4,314,620 | 2/1982 | Gollehon . | |
| 4,437,540 | 3/1984 | Murakami et al. . | |
| 4,733,749 | 3/1988 | Newman et al. . | |
| 4,923,031 | 5/1990 | Carlson . | |
| 5,115,883 | 5/1992 | Morikawa et al. | 181/152 |
| 5,258,584 | 11/1993 | Hubbard . | |
| 5,278,361 | 1/1994 | Field . | |
| 5,313,525 | 5/1994 | Klasco | 181/156 |
| 5,526,456 | 6/1996 | Heinz . | |

*Primary Examiner*—Khanh Dang
*Attorney, Agent, or Firm*—Mark A. Rogers; Gary N. Speed; Mark M. Henry

[57] ABSTRACT

A loudspeaker is disclosed in which an enclosure is provided with a horn. A driver and vent are provided in side walls of the horn, spaced from a central axis of the horn. The vent is aligned so that when the central axis of the horn is horizontal and a central axis of said vent does not lie in a vertical plane containing the central axis of the horn, the central axis of the vent intersects the vertical plane containing the central axis of the horn. The driver, preferably a woofer, may also be aligned so that when the central axis of the horn is horizontal and a central axis of said driver does not lie in a vertical plane containing the central axis of the horn, the central axis of the driver intersects the vertical plane containing the central axis of the horn. The central axis of the vent and the central axis of the driver preferably intersect the central axis of the horn, more preferably intersect the central axis of the horn rearward of the mouth of the horn and most preferably intersect the central axis of the horn rearward of front edges of the vent and driver. The design merges the designs of a horn loudspeaker and bass reflex loudspeaker to arrive at a loudspeaker having some of the benefits of both designs.

12 Claims, 2 Drawing Sheets

LOADSPEAKER HAVING HORN LOADED DRIVER AND VENT

BACKGROUND OF THE INVENTION

This invention relates to loudspeakers and, more particularly, to horn loaded loudspeakers.

The range of hearing for a young person typically includes sound frequencies having wavelengths from approximately 20 Hz to approximately 20 kHz. The upper limit typically falls with age to approximately 10–15 kHz. In speaker design, ideally one would like to have a single speaker that could faithfully reproduce sound over the full range of audible wavelengths. This is generally considered impractical, in part because different loudspeaker characteristics are desirable for reproducing sound at different wavelengths. For example, it is typically desirable to have a driver diaphragm that less mass at higher frequencies and more mass at lower frequencies.

Similarly, it is typically desirable to have a driver magnet having less mass for reproducing sounds at lower frequencies and having more mass for reproducing sounds at higher frequencies.

Because of the different properties that are desirable for reproducing sound waves having different frequencies, different drivers are typically used for reproducing different ranges of frequencies. For example, a sub-woofer may be used to reproduce sound waves having a frequencies of approximately 80–100 Hz or less. A woofer is typically used to reproduce sound waves having frequencies from approximately 80 Hz to approximately 400 or 800 Hz; some woofers are being used to reproduce sound waves having frequencies of as high as approximately 1200 Hz. Mid range drivers are typically used to reproduce sounds from approximately 300 Hz to approximately 7 kHz, and tweeters are typically used to reproduce sounds from approximately 1500 Hz to approximately 20 kHz.

Loudspeakers using horn loading or using a bass reflex system are known in the art, each design offering its own advantages and disadvantages. In a horn loudspeaker, a horn is typically an angled or curved tube with a gradually increasing cross section area that shapes and directs sound radiating from the horn. A horn is typically made of metal, plastic or wood. In designing a horn for a loudspeaker, the curvature of the horn side walls is typically determined using a selected mathematical equation or formula depending upon the desired characteristics of the loudspeaker. Horn loaded loudspeakers offer a number of advantages. For example, a horn loaded speaker, in which a horn is placed in front of a driver, such as a woofer, is a highly efficient speaker, providing relatively high sound pressure levels with relatively low power input. To better understand the improved efficiency and the directivity of a horn loaded loudspeaker, it may be helpful to visualize the effect a megaphone has on cheers or instructions shouted or spoken into it. If the horn is well designed, the horn loaded speaker also offers a smooth frequency response. Although they offer many advantages, horn loaded speakers are not without problems. When the size of the loudspeaker is a concern, a horn loaded speaker is relatively large, particularly when the speaker is designed to extend into lower frequencies.

In a bass reflex or vented box type system, a vent is added to a closed box that typically has a direct radiation driver, and the vent is tuned so that the sound radiating from the vent effectively adds to the direct sound from the driver. A bass reflex system provides good low frequency extension, improving the driver response near the low cut-off frequency, particularly for woofers. Venting such as is done in a bass reflex system provides the most benefits for drivers reproducing low frequency sound waves and does not provide as significant benefits for drivers reproducing higher frequency sound waves such as tweeters and mid-range drivers. When size is of concern, a relatively small bass reflex system can offer good performance, particularly for a speaker designed to extend into lower frequencies. A bass reflex system, however, is relatively inefficient and has higher distortion than a well-designed horn loaded system.

SUMMARY OF THE INVENTION

It is therefore an object of the present invention to provide a loudspeaker that combines the advantages of a horn loaded system with the advantages of a bass reflex system.

It is a further object of the present invention to provide a system of the above type that combines the efficiency and sound quality advantages of a horn loaded system with the improved low frequency response and size advantages of a bass reflex system.

It is a still further object of the present invention to provide a system of the above type that provides a truly horn loaded vent and driver.

It is a still further object of the present invention to provide a system of the above type in which a vent and driver share a horn.

It is a still further object of the present invention to provide a system of the above type that is compact.

It is a still further object of the present invention to provide a system of the above type in which the low frequency response improvements offered by the vent permit a shorter horn to be used.

It is a still further object of the present invention to provide a system of the above type that allows a vent and driver to share a horn without interfering with each other physically or performance-wise.

It is a still further object of the present invention to provide a system of the above type that uses a dual throated, bent horn to accommodate horn loading of a vent and driver.

Toward the fulfillment of these and other objects and advantages, the loudspeaker of the present invention comprises an enclosure having a horn. A driver and vent are provided in side walls of the horn, spaced from a central axis of the horn. The vent is aligned so that when the central axis of the horn is horizontal and a central axis of the vent does not lie in a vertical plane containing the central axis of the horn, the central axis of the vent intersects the vertical plane containing the central axis of the horn. The driver, preferably a woofer, may also be aligned so that when the central axis of the horn is horizontal and a central axis of the driver does not lie in a vertical plane containing the central axis of the horn, the central axis of the driver intersects the vertical plane containing the central axis of the horn. The central axis of the vent and the central axis of the driver preferably intersect the central axis of the horn, more preferably intersect the central axis of the horn rearward of the mouth of the horn and most preferably intersect the central axis of the horn rearward of front edges of the vent and driver.

BRIEF DESCRIPTION OF THE DRAWINGS

The above brief description, as well as further objects, features and advantages of the present invention will be more fully appreciated by reference to the following detailed description of the presently preferred but nonetheless illustrative embodiments in accordance with the present invention when taken in conjunction with the accompanying drawings, wherein.

DETAILED DESCRIPTION OF THE PREFERRED EMBODIMENT

Figure 1:
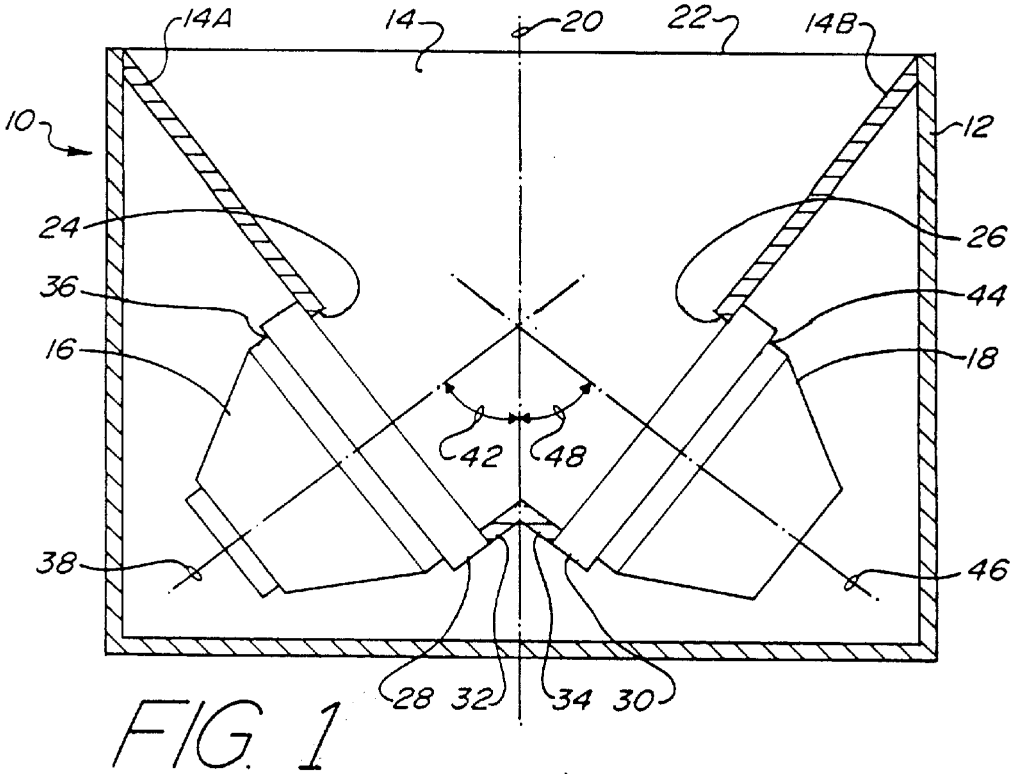
FIG. 1 is an elevation view of a loudspeaker of the present invention.

Referring to FIG. 1, the reference numeral 10 refers in general to a loudspeaker of the present invention. The loudspeaker 10 has an enclosure 12, a horn 14, a driver 16 and a vent 18. The driver 16 and vent 18 are disposed in side walls 14A and 14B of the horn 14, spaced from a central axis 20 of the horn 14.

The enclosure 12 may be any conventional enclosure used in connection with loudspeakers, may take any number of shapes and sizes and may be constructed of any conventional material used in connection with loudspeaker enclosures. In the preferred embodiment, for a loudspeaker 10 having a range of from approximately 35 Hz to approximately 1000 Hz, the enclosure is made from wood and is rectangular, having a width of approximately 14 inches, a height of approximately 7 inches and a depth of approximately 12 inches. The enclosure 12 has an opening on a front side in which the horn 14 is mounted.

Figure 2:
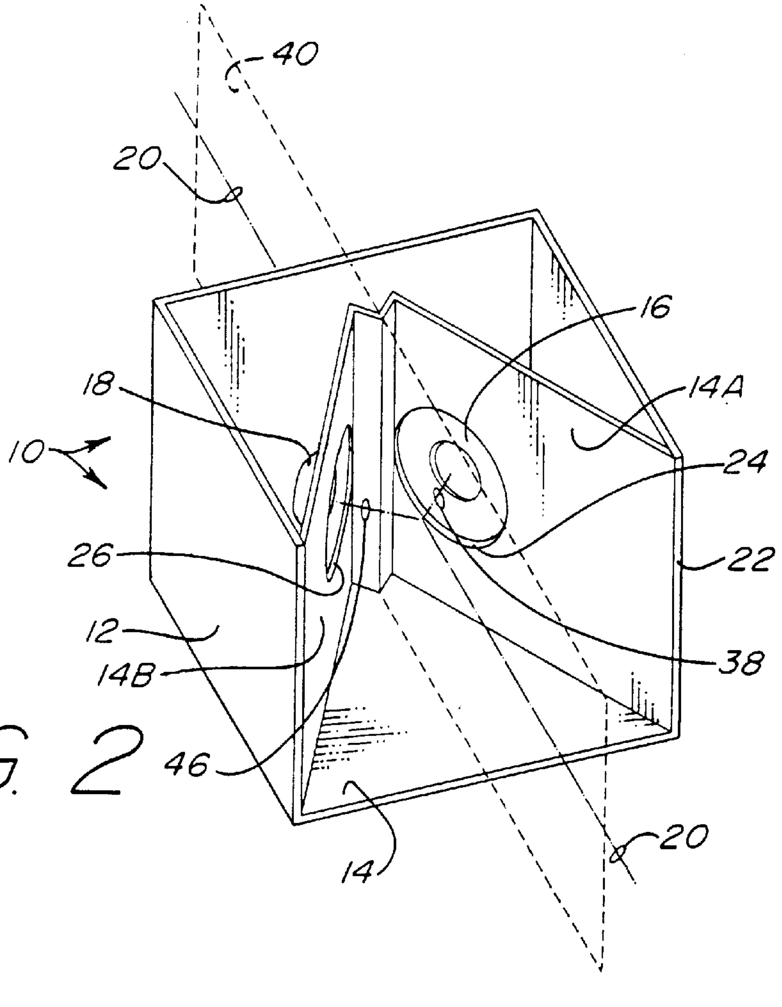
FIG. 2 is a view of a loudspeaker of the present invention taken along lines 2—2 of FIG. 1.

As best shown in FIG. 2, the horn 14 is an exponential horn. The horn 14 has a rectangular mouth 22 at the front of the horn, and the side walls 14A and 14B have two circular openings 24 and 26, each spaced from the central axis 20 of the horn and each having a diameter of approximately 6 inches. Baffle boards 28 and 30 having a thickness of approximately 1 inch are secured to rear surfaces of the horn side walls 14A and 14B, respectively, at rear portions of the side walls. Rear edges of the openings 24 and 26 are approximately 1.5 inches to approximately 2 inches from the central axis 20 of the horn 14. Inner side wall 32 extends forward from a point near the rear edge of the opening 24 to the central axis 20 of the horn 14, and inner side wall 34 extends forward from a point near the rear edge of the opening 26 to the central axis 20 of the horn. Because the vent 18 will help extend the performance of the loudspeaker to lower frequencies, the horn 14 is designed with a flare rate that is higher in cutoff than normal. This permits the horn 14 to be shorter than normal.

It is understood that there is a great degree of flexibility in the size and shapes of the horn 14, mouth 22 and openings 24 and 26, and that their size, shape and positioning will vary depending upon the desired characteristics of the loudspeaker. For example, although the preferred embodiment utilizes an exponential horn, it is understood that any conventional horn shape may be utilized, including but not limited to exponential, conical, hyperbolic, Tractrix or combinations of these. Also, although the mouth 22 is described as being rectangular, it could be any conventional shape, including but not limited to rectangular, square, circular or oval. Similarly, although the openings 24 and 26 are described as being circular, they could be any conventional shape, including but not limited to, circular, oval, square or rectangular.

In the preferred embodiment, the driver 16 is a 6.5 inch woofer which is secured to the baffle board 28. The baffle board 28 has an opening 24 with which the driver 16 is aligned, and the rear edge of this opening 24, where the driver is connected to the baffle board 28, is considered a throat 36 of the horn 14. It is understood that a baffle board 28 is not required and that the throat 36 of the horn 14 is at the rear edge of the opening 24 to which the driver 16 is secured, whether the driver is secured to a baffle board 28, the rear surface of the horn 14 or some other structure. The driver 16 is aligned so that when the central axis 20 of the horn 14 is horizontal, and a central axis 38 of the driver 16 does not lie in a vertical plane 40 containing the central axis 20 of the horn 14, the central axis 38 of the driver 16 preferably intersects the vertical plane 40 containing the central axis 20 of the horn 14 and more preferably intersects the central axis 20 of the horn. The central axis 38 of the driver 16 preferably intersects the central axis 20 of the horn 14 rearward of the mouth 22 and more preferably intersects the central axis 20 of the horn rearward of the front edge of the driver. It is understood that there is a high degree of flexibility in the design of the angle 42 formed between the central axis 38 of the driver 16 and the central axis 20 of the horn 14. If the loudspeaker is being designed to extend to higher frequencies, the angle 42 should be relatively small. If the loudspeaker is being designed to extend to lower frequencies, the angle 42 may be larger.

The horn 14 is said to be "bent" because the central axis 38 of the driver 16 does not coincide with, but instead converges at an angle 42 toward, the central axis 20 of the horn 14. In a loudspeaker where the central axis 38 of the driver 16 corresponds with the central axis 20 of the horn 14, the horn is not "bent" relative to the driver; as the angle 42 between the central axis 38 of the driver and the central axis 20 of the horn increases, the horn is said to be more "bent". Increasing the angle 42 permits one to reduce the depth of the enclosure required to house the horn 14, thereby reducing the size of the loudspeaker. It is understood that the horn 14 need not be bent and that the driver 16 may be coaxially aligned with the horn 14, in which case the driver and vent 18 are asymmetrically disposed about the central axis 20 of the horn, and the vent has no corresponding vent symmetrically disposed about the central axis of the horn. In the preferred embodiment, the driver 16, a woofer, operates primarily at frequencies ranging from approximately 80 Hz to approximately 1000 Hz. It is understood that any conventional driver 16 may be used, including but not limited to a sub-woofer, woofer, mid range or tweeter, and that any number of sizes or shapes of drivers may be used.

Figure 3:
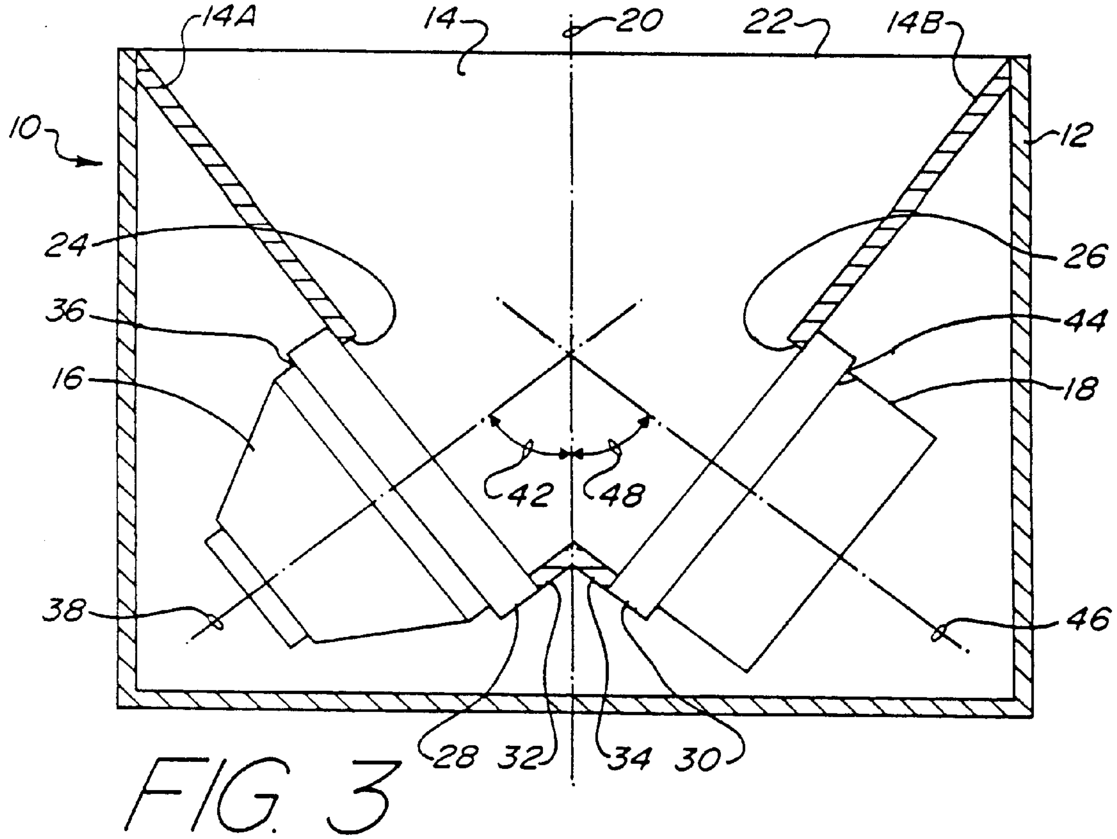
FIG. 3 is an alternate embodiment of the loudspeaker shown in FIG. 2.
Figure 4:
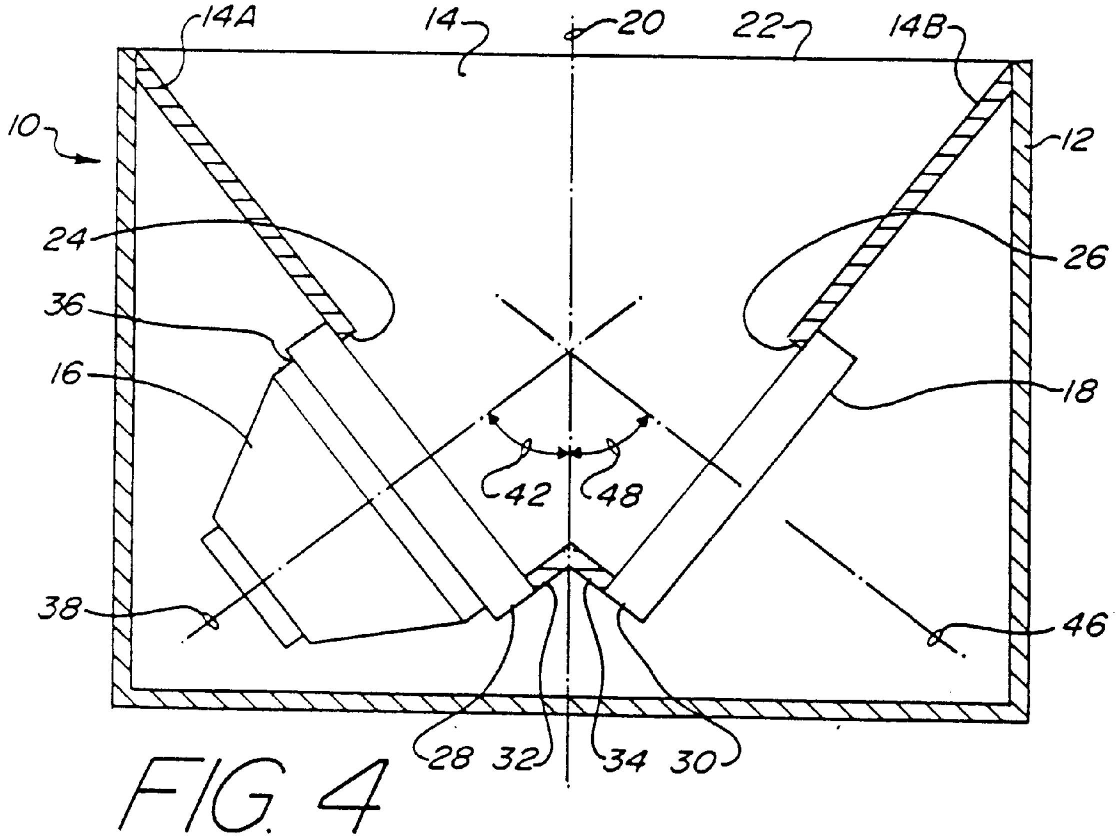
FIG. 4 is an alternate embodiment of the loudspeaker shown in FIG. 2

The vent 18 may be any conventional vent as is typically used in a bass reflex system, including but not limited to a port or a drone. A port is a properly shaped and positioned hole, duct or cylindrical tube. A drone is a cone-shaped, passive radiator. FIG. 2 depicts a loudspeaker 10 in which the vent 18 is a drone, FIG. 3 depicts a loudspeaker 10 in which the vent 18 is a duct or cylindrical tube and FIG. 4 depicts a loudspeaker 10 in which the vent 18 is a hole. The vent 18 is tuned so that the sound radiating through it is in phase with the sound emanating from the driver 16. Tuning a hole or tube primarily involves selecting a desired diameter and length. Tuning a drone may involve selecting a desired diameter and length, and a drone also permits one to adjust the compliance of the air in the vent 18 by adjusting the temperature of the mass of air within the drone.

In the preferred embodiment, the vent 18 is a 6.5 inch drone which is secured to the baffle board 30. The baffle board 30 has an opening 26 with which the vent 18 is aligned, and the rear edge of this opening 26, where the vent is connected to the baffle board 30, is considered a throat 44 of the horn 14. The vent 18 is aligned so that when the central axis 20 of the horn 14 is horizontal, and a central axis 46 of the vent does not lie in a vertical plane 40 containing the central axis 20 of the horn, the central axis 46 of the vent preferably intersects the vertical plane 40 containing the central axis 20 of the horn and more preferably intersects the central axis 20 of the horn. The central axis 46 of the vent 18 preferably intersects the central axis 20 of the horn 14 rearward of the mouth 22 and more preferably intersects the central axis 20 of the horn rearward of the front edge of the drone. The vent 18 is tuned to operate primarily at frequencies from approximately 35 Hz to approximately 80Hz. Because the woofer and vent 18 are tuned to different frequencies, the vent produces the vast majority of the sound pressure level from approximately 35 Hz to approximately 80 Hz, and the woofer produces the vast majority of the sound pressure level from approximately 80 Hz to approximately 1000 Hz. Because the vent 18 and driver 16 are operating over primarily different frequencies, the vent 18 and driver 16 may share the horn 14 with minimal interference.

It is understood that there is a high degree of flexibility in the design of the vent 18 and in the design of the angle 48 formed between the central axis 46 of the vent 18 and the central axis 20 of the horn 14. As discussed above in connection with the driver 16, if the loudspeaker is being designed to extend to higher frequencies, the angle 48 between should be relatively small. If the loudspeaker is being designed to extend to lower frequencies, the angle 48 may be larger. Increasing the angle 48 permits one to reduce the depth of the enclosure required to house the horn 14, thereby reducing the size of the loudspeaker. It is understood that the horn 14 need not be bent and that the vent 18 may be coaxially aligned with the horn 14, in which case the driver and driver 16 are asymmetrically disposed about the central axis 20 of the horn, and the driver 16 has no corresponding driver symmetrically disposed about the central axis of the horn. It is understood that any conventional vent be used, including but not limited to a drone or a port, and that any number of sizes or shapes of vents may be used.

Other modifications, changes and substitutions are intended in the foregoing, and in some instances, some features of the invention will be employed without a corresponding use of other features. For example, although the loudspeaker 10 is described as having a driver 16 and a vent 18, any number of drivers or vents may be used. Also, although the vent 18 and driver 16 are described as being near the rear of the horn 14, it is understood that there is a great degree of flexibility in the positioning of the vent and driver. Similarly, it is understood that there is a great degree of flexibility in the tuning of the vent 18, and the vent may be tuned to a range of frequencies overlapping or coinciding with the range of frequencies of the driver 16. Further still, the positioning of the vent 18 and driver 16 need not be symmetrical. It is of course understood that the particular measurements, sizes and frequencies provided are intended as examples only and should not be read as limiting the scope of the invention. Accordingly, it is appropriate that the appended claims be construed broadly and in a manner consistent with the scope of the invention.

What is claimed is:

1. A loudspeaker, comprising:

an enclosure;

a horn secured to said enclosure;

a driver secured to said horn, spaced from a central axis of said horn; and a vent secured to said horn, spaced from said central axis of said horn, said vent being aligned so that when a central axis of said horn is horizontal and a central axis of said vent does not lie in a vertical plane containing said central axis of said horn, said central axis of said vent intersects said vertical plane containing said central axis of said horn.

2. The loudspeaker of claim 1 wherein said vent is aligned so that said central axis of said vent intersects said central axis of said horn.

3. The loudspeaker of claim 1 wherein said horn has a mouth at a front portion thereof and said central axis of said vent intersects said vertical plane at a point rearward of said mouth.

4. The loudspeaker of claim 1 wherein said driver is aligned so that when a central axis of said horn is horizontal and a central axis of said driver does not lie in a vertical plane containing said central axis of said horn, said central axis of said driver intersects said vertical plane containing said central axis of said horn.

5. The loudspeaker of claim 1 wherein said driver is aligned so that a central axis of said driver intersects said central axis of said horn.

6. The loudspeaker of claim 1 wherein said horn has a mouth at a front portion thereof and said central axis of said driver intersects said vertical plane at a point rearward of said mouth.

7. The loudspeaker of claim 2 wherein said driver is aligned so that a central axis of said driver intersects said central axis of said horn.

8. The loudspeaker of claim 7 wherein said central axis of said vent and said central axis of said driver intersect said central axis of said horn at a substantially common location.

9. The loudspeaker of claim 8 wherein said horn has a mouth at a front portion thereof and said central axis of said vent and said central axis of said driver intersect said central axis of said horn rearward of said mouth.

10. A loudspeaker, comprising:

an enclosure;

a horn having a first side wall and a second side wall, said horn being secured to said enclosure, said horn having a first throat in a first side wall and a second throat in a second side wall, said first and second throats being spaced from a central axis of said horn;

a driver secured to said horn at said first throat, said driver being aligned so that when a central axis of said horn is horizontal and a central axis of said driver does not lie in a vertical plane containing said central axis of said horn, said central axis of said driver intersects said vertical plane containing said central axis of said horn; and a vent secured to said horn at said second throat.

11. The loudspeaker of claim 10 wherein said driver is aligned so that said central axis of said driver intersects said central axis of said horn.

12. The loudspeaker of claim 10 wherein said horn has a mouth at a front portion thereof and said central axis of said driver intersects said vertical plane at a point rearward of said mouth.

* * * * *